United States Patent
Xu et al.

(10) Patent No.: US 7,068,108 B2
(45) Date of Patent: Jun. 27, 2006

(54) AMPLIFIER APPARATUS AND METHOD

(75) Inventors: Gonggui Xu, Plano, TX (US); Haydar Bilhan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/958,507

(22) Filed: Oct. 5, 2004

(65) Prior Publication Data

US 2005/0151590 A1 Jul. 14, 2005

Related U.S. Application Data

(60) Provisional application No. 60/537,063, filed on Jan. 16, 2004, provisional application No. 60/535,276, filed on Jan. 9, 2004.

(51) Int. Cl.
*H03G 3/10* (2006.01)

(52) U.S. Cl. .................. 330/284; 330/69; 330/254

(58) Field of Classification Search ............... 330/284, 330/69, 254
See application file for complete search history.

(56) References Cited

U.S. PATENT DOCUMENTS

| | | | | |
|---|---|---|---|---|
| 3,863,200 A | * | 1/1975 | Miller | ............ 367/65 |
| 6,127,893 A | * | 10/2000 | Llewellyn et al. | .......... 330/284 |
| 6,545,534 B1 | * | 4/2003 | Mehr | ............ 330/69 |

OTHER PUBLICATIONS

J.J.F. Rijns, "CMOS Low-Distortion High-Frequency Variable-Gain Amplifier", IEEE Journal of Solid State Circuits, vol. 31, pp. 1029-1034, Jul. 1996.
L. Moldovan and H.H. Li, "A Rail-to-Rail Constant Gain Buffered Op- Amp or Real Time Video Applications", IEEE Journal of Solid-State Circuits, vol. 32, pp. 169-176, Feb. 1997.
Thonmas H. Lee, "The Design of CMOS Radio-Frequency Integrated Circuits", pp. 184-187; Cambridge University, Press, 1998.

* cited by examiner

Primary Examiner—Patricia Nguyen
(74) Attorney, Agent, or Firm—Alan K. Stewart; W. James Brady, III; Frederick J. Telecky, Jr.

(57) ABSTRACT

An amplifier apparatus having a gain programmable in discrete increments includes: (a) an operational amplifier having a first and second input and an output; (b) a feedback circuit between the output and the second input; (c) a reference signal source and supply circuit coupled with the first input; (d) a first resistor network coupled between a first signal locus and the first input conveying a first input signal to the first input and including a first plurality of parallel-connected first resistors; selected first resistors being independently coupled in a first connecting with the first input; (e) a second resistor network coupled between a second signal locus and the second input conveying a second input signal to the second input and including a second plurality of parallel-connected second resistors; selected second resistors being independently coupled in a second connecting with the second input.

20 Claims, 2 Drawing Sheets

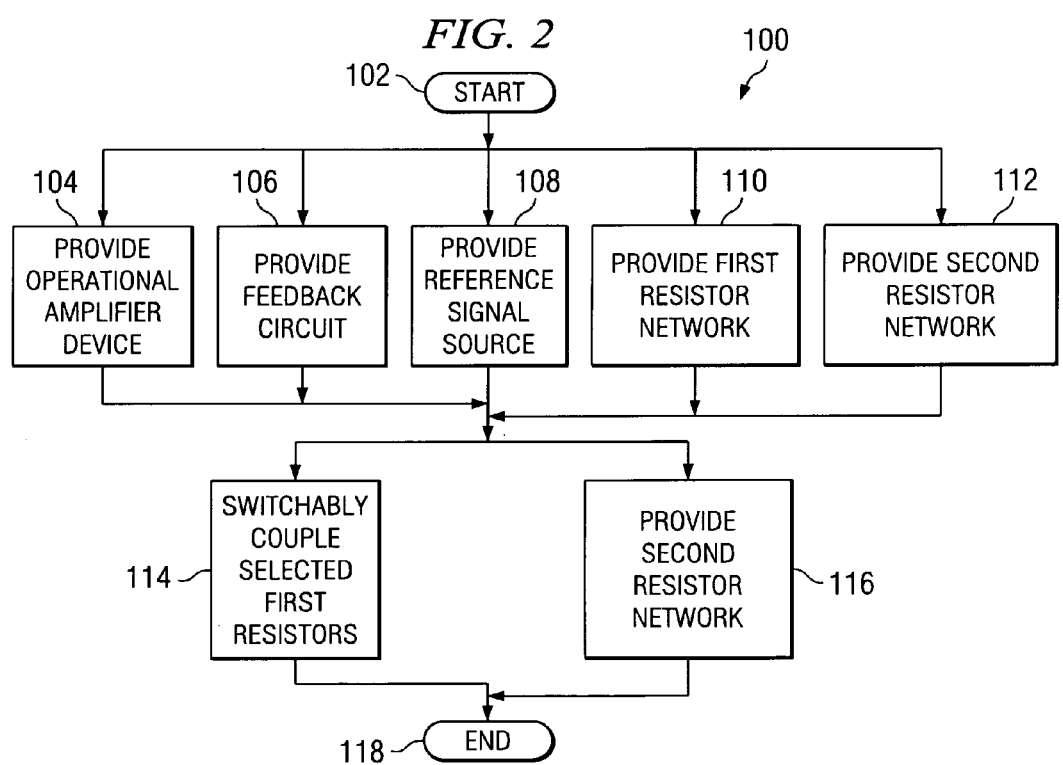

US 7,068,108 B2

AMPLIFIER APPARATUS AND METHOD

This application claims benefit of prior filed copending Provisional Patent Application Ser. No. 60/535,276, filed Jan. 9, 2004; and claims benefit of prior filed copending Provisional Patent Application Ser. No. 60/537,063, filed Jan. 16, 2004.

BACKGROUND OF THE INVENTION

The present invention is directed to electrical amplifier apparatuses, and especially to electrical amplifier apparatuses embodied in programmable gain amplifiers. Programmable gain is a useful feature for an amplifier apparatus for many reasons. An important reason is that a manufacturer may produce a particular model of a product that may be employed by customers for a variety of applications. By producing such multi-use products, a manufacturer may be able to carry fewer individual parts in inventory, and a customer may be able to finely tune a product to provide peak performance in a particular device.

By way of example and not by way of limitation, electrical amplifier apparatuses embodied in programmable gain amplifiers are used in video output buffer circuitry in video decoder applications. Many electronic applications are presently experiencing increased use of digital technology. In order to provide back compatibility from newer digital models to older analog models, such as in video applications, a video decoder may be provided for digitizing base-band analog video formats into digital component video signals. Such back compatibility is useful, by way of example and not by way of limitation, in television (TV), video cassette recorders (VCR), digital video disc recorders (DVDR) and camcorders. To properly monitor decoding process, the electrical amplifier apparatuses can be used as a video output buffer circuit to provide maximum amplitude that can be programmed for different applications.

Others have addressed this design requirement previously. In J. J. F. Rijns, "CMOS Low-Distortion High-Frequency Variable-Gain Amplifier", IEEE Journal of Solid State Circuits, Vol. 31, pp. 1029–1034, July 1996 (hereinafter referred to as "Rijns"), Rijns discloses an analog input signal being first transformed into a current signal, and the current flows through a programmable resistor to achieve a variable gain. Such a transconductance approach is sufficient for internal driving of devices on-chip. However, such an approach may not suffice when driving a large off-chip capacitance, e.g., on the order of 10 pF. In L. Moldovan and H. H. Li, "A Rail-to-Rail Constant Gain Buffered Op-Amp or Real Time Video Applications", IEEE Journal of Solid-State Circuits, Vol. 32, pp. 169–176, February 1997 (hereinafter referred to as "Moldovan"), Moldovan discloses a rail-to-rail buffer amplifier that cannot have a variable gain.

There is a need for a variable gain amplifier apparatus capable of driving large off-chip capacitive loading with little distortion.

There is a need for a method for buffering a signal with a programmable gain that is appropriate for driving large off-chip capacitive loading with little distortion.

SUMMARY OF THE INVENTION

An amplifier apparatus having a gain programmable in discrete increments includes: (a) an operational amplifier having a first and second input and an output; (b) a feedback circuit between the output and the second input; (c) a reference signal source and supply circuit coupled with the first input; (d) a first resistor network coupled between a first signal locus and the first input conveying a first input signal to the first input and including a first plurality of parallel-connected first resistors; selected first resistors being independently coupled in a first connecting with the first input; (e) a second resistor network coupled between a second signal locus and the second input conveying a second input signal to the second input and including a second plurality of parallel-connected second resistors; selected second resistors being independently coupled in a second connecting with the second input. The gain is established by at least one of the supply circuit and the selected first resistors, and the feedback circuit and the selected second resistors.

It is, therefore, an object of the present invention to provide a variable gain amplifier apparatus capable of driving large off-chip capacitive loading with little distortion.

It is a further object of the present invention to provide a method for buffering a signal with a programmable gain that is appropriate for driving large off-chip capacitive loading with little distortion.

Further objects and features of the present invention will be apparent from the following specification and claims when considered in connection with the accompanying drawings, in which like elements are labeled using like reference numerals in the various figures, illustrating the preferred embodiments of the invention.

BRIEF DESCRIPTION OF THE DRAWINGS

FIG. 2 is a flow diagram illustrating the method of the present invention.

DETAILED DESCRIPTION OF THE PREFERRED EMBODIMENT

Figure 1:
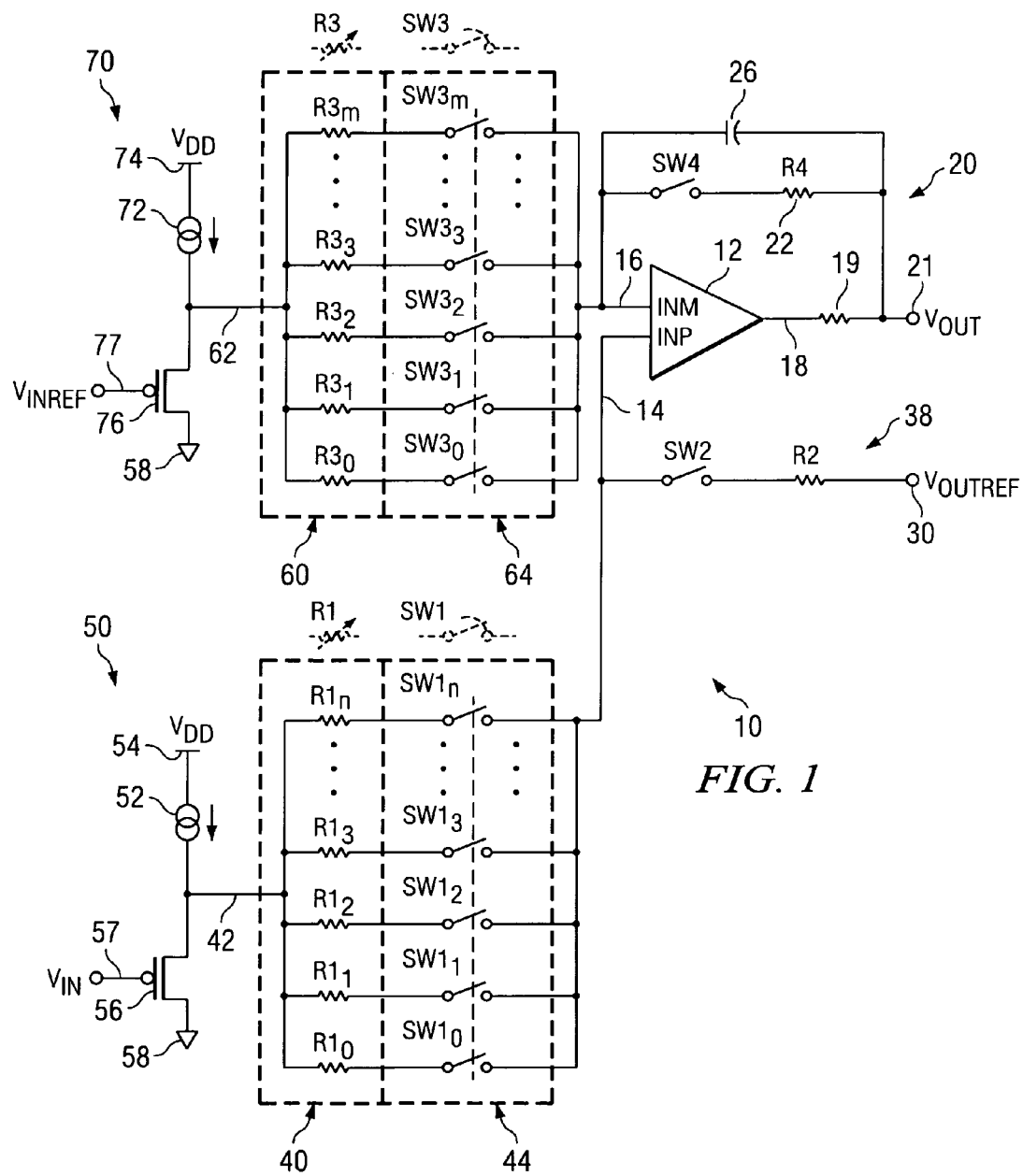
FIG. 1 is an electrical schematic diagram illustrating the preferred embodiment of the apparatus of the present invention.

FIG. 1 is an electrical schematic diagram illustrating the preferred embodiment of the apparatus of the present invention. In FIG. 1, an amplifier apparatus 10 includes an operational amplifier device 12 having a first input locus 14, a second input locus 16 and an output locus 18. A resistor 19 is coupled between output locus 18 and an output signal connector 21. An output signal $V_{OUT}$ is presented at output signal connector 21. A feedback circuit 20 is coupled between output connector 21 and second input locus 16. Feedback circuit 20 includes a resistor R4 connected in series with a dummy always-closed switch SW4. Feedback circuit 20 also includes a capacitor 26 coupled in parallel with resistor R4 and dummy switch SW4.

A supply circuit 38 is coupled between a signal input connector 30 and first input locus 14. Supply circuit 38 includes a resistor R2 and a dummy always-closed switch SW2. A reference signal $V_{OUTREF}$ is provided at a signal input connector 30. Reference signal $V_{OUTREF}$ is applied to first input locus 14 via supply circuit 38. Reference signal $V_{OUTREF}$ participates in setting the offset signal value about which output signals $V_{OUT}$ presented at output connector 30 are substantially centered.

A first resistor network 40 is coupled with first input locus 14. First resistor network 40 includes a plurality of resistors $R1_0$, $R1_1$, $R1_2$, $R1_3$, $R1_n$. The indicator "n" is employed to signify that there can be any number of resistors in first resistor network 40. The inclusion of five resistors $R1_0$, $R1_1$, $R1_2$, $R1_3$, $R1_n$ in FIG. 1 is illustrative only and does not constitute any limitation regarding the number of resistors that may be included in the first resistor network of the present invention. Resistors $R1_0$, $R1_1$, $R1_2$, $R1_3$, $R1_n$ are coupled in parallel between a first resistor network input locus 42 and a switch network 44. Switch network 44 including switches $SW1_0$, $SW1_1$, $SW1_2$, $SW1_3$, $SW1_n$ selectively couples respective resistors $R1_0$, $R1_1$, $R1_2$, $R1_3$, $R1_n$ in parallel with first input locus 14. Each respective resistor $R1_0$, $R1_1$, $R_2$, $R1_3$, $R1_n$ is independently switchingly coupled with first input locus 14 via a respective switch $SW1_0$, $SW1_1$, $SW1_2$, $SW1_3$, $SW1_n$.

Programming switches $SW1_0$, $SW1_1$, $SW1_2$, $SW1_3$, $SW1_n$ (referred to generally as SW1, as indicated in dotted line format in FIG. 1) and dummy switch SW2 are preferably kept at substantially the same voltage potential level so that the distortion from these switches can track each other and substantially cancel out. In the preferred embodiment of the invention illustrated in FIG. 1, switches SW1, SW2 are coupled to the virtual ground of operational amplifier device 12 at input locus 14.

First resistor network input locus 42 is coupled with a first signal generating circuit 50. First signal generating circuit 50 includes a current source 52 coupled between a supply voltage input locus 54 and a PMOS transistor 56. A supply voltage $V_{DD}$ is provided at supply voltage input locus 54. PMOS transistor 56 receives an input signal $V_{IN}$ at its gate 57.

By such an independently switchable arrangement among resistors $R1_0$, $R1_1$, $R1_2$, $R1_3$, $R1_n$, selected resistors of resistors $R1_0$, $R1_1$, $R1_2$, $R1_3$, $R1_n$ may be included in the connection established between first signal generating circuit 50 and first input locus 14.

A second resistor network 60 is coupled with second input locus 16. Second resistor network 60 includes a plurality of resistors $R3_0$, $R3_1$, $R3_2$, $R3_3$, $R3_m$. The indicator "m" is employed to signify that there can be any number of resistors in second resistor network 60. The inclusion of five resistors $R3_0$, $R3_1$, $R3_2$, $R3_3$, $R3_m$ in FIG. 1 is illustrative only and does not constitute any limitation regarding the number of resistors that may be included in the second resistor network of the present invention. Resistors $R3_0$, $R3_1$, $R3_2$, $R3_3$, $R3_m$ are coupled in parallel between a second resistor network input locus 62 and a switch network 64. Switch network 64 including switches $SW3_0$, $SW3_1$, $SW3_2$, $SW3_3$, $SW3_m$ selectively couples respective resistors $R3_0$, $R3_1$, $R3_2$, $R3_3$, $R3_m$ in parallel with second input locus 16. Each respective resistor $R3_0$, $R3_1$, $R3_2$, $R3_3$, $R3_m$ is independently switchingly coupled with second input locus 16 via a respective switch $SW3_0$, $SW3_1$, $SW3_2$, $SW3_3$, $SW3_m$.

Programming switches $SW3_0$, $SW3_1$, $SW3_2$, $SW3_3$, $SW3_m$ (referred to generally as SW3, as indicated in dotted line format in FIG. 1) and dummy switch SW4 are preferably kept at substantially the same voltage potential level so that the distortion from these switches can track each other and substantially cancel out. In the preferred embodiment of the invention illustrated in FIG. 1, switches SW3, SW4 are coupled to the virtual ground of operational amplifier device 12 at input locus 16.

Second resistor network input locus 62 is coupled with a second signal generating circuit 70. Second signal generating circuit 70 includes a current source 72 coupled between a supply voltage input locus 74 and a PMOS transistor 76. Supply voltage $V_{DD}$ is provided at supply voltage input locus 74. PMOS transistor 76 receives an input signal $V_{INREF}$ at its gate 77.

By such an independently switchable arrangement among resistors $R3_0$, $R3_1$, $R3_2$, $R3_3$, $R3_m$, selected resistors of resistors $R3_0$, $R3_1$, $R3_2$, $R3_3$, $R3_m$ may be included in the connection established between second signal generating circuit 70 and second input locus 16.

Operational amplifier device 12 is preferably configured for non-inverting operation. In such a configuration, first input locus 14 and second input locus 16 are substantially equal. Said another way, operational amplifier device 12 continually strives to present an output signal at output locus 18 which places second input locus 16 at equal potential with first input locus 14. Input loci 14, 16 are thus said to be at virtual ground. Given this configuration, the direct current (DC) transfer function of amplifier apparatus 10 is given by:

$$V_{OUT} = V_{OUTREF} + \text{Gain} \cdot (V_{IN} - V_{INREF}) \quad [1]$$

$$\text{Where Gain} = \frac{R_2}{R_1} = \frac{R_4}{R_3}$$

That is, the gain is established by a resistor ratio. The output offset of amplifier apparatus 10 is controlled by fixed reference voltage $V_{OUTREF}$. If input signal $V_{INREF}$ tracks input signal $V_{IN}$ and the two signals $V_{INREF}$, $V_{IN}$ have the same offset, expression [1] confirms that the input offset will not be gained up (i.e., will not be amplified). This characteristic of independent signal offset adjustment aids in maximizing output swing of amplifier apparatus 10.

The programmable gain of amplifier apparatus 10 is established by resistor R1 (i.e., the effective resistance of first resistor network 40) and resistor R3 (i.e., the effective resistance of second resistor network 60). Programming is effected by selecting among resistors $R1_0$, $R1_1$, $R1_2$, $R1_3$, $R1_n$ using switches $SW1_0$, $SW1_1$, $SW1_2$, $SW1_3$, $SW1_n$ and by selecting among resistors $R3_0$, $R3_1$, $R3_2$, $R3_3$, $R3_m$ using switches $SW3_0$, $SW3_1$, $SW3_2$, $SW3_3$, $SW3_m$. Expression [1] also indicates that the preferred embodiment of the amplifier apparatus 10 has equal numbers of resistors and switches $R1_n$, $R3_m$, $SW1_n$, $SW3_m$. That is, it is preferred than m=n. In its most preferred embodiment, amplifier apparatus 10 has substantially identical resistor networks 40, 60.

Because of considerations relating to distortion, it is preferred that resistor networks 40, 60 are configured as parallel resistor networks as opposed to series resistor networks. This is because a parallel network permits switches coupled in series with respective resistors in the network to be placed at the same potential. In the configuration of amplifier apparatus 10, each of switches $SW1_n$, $SW3_m$ are coupled to the virtual ground of operation amplifier device 12 at input loci 14, 16. Another advantage provided by a parallel resistor network is that each of respective switches $SW1_n$, $SW3_m$ can be selected according to the respective series resistor $R1_n$, $R3_m$ to which they are connected. Such a design capability for matching of non-linear switch-on resistance contributes significantly to good distortion performance.

The design of amplifier apparatus 10 facilitates establishing gain programmability implementing linear gain steps. By way of example and not by way of limitation, if one assumes that feedback resistors R2=R4=R, then choosing input resistors R1=R3 embodied in a parallel resistor array of 5R, 2.5R, 1.25 R and 0.625R can yield a linear gain increment of 0.2:

$$\frac{R}{1} = R \quad [2]$$

$$\frac{R}{1.2} = \frac{1}{\left(\frac{1}{R} + \frac{1}{5R}\right)} \quad [3]$$

$$\frac{R}{1.4} = \frac{1}{\left(\frac{1}{R} + \frac{1}{2.5R}\right)} \quad [4]$$

$$\frac{R}{1.6} = \frac{1}{\left(\frac{1}{R} + \frac{1}{2.5R} + \frac{1}{5R}\right)} \quad [5]$$

$$\vdots$$

$$\frac{R}{4.0} = \frac{1}{\left(\frac{1}{R} + \frac{1}{0.625R} + \frac{1}{1.25R} + \frac{1}{2.5R} + \frac{1}{5R}\right)} \quad [6]$$

Expression [3] reflects switchingly connecting resistors valued R and 5R in parallel. Expression [4] reflects switchingly connecting resistors valued R and 2.5R in parallel. Expression [5] reflects switchingly connecting resistors valued R, 2.5R and 5R in parallel. Expression [6] reflects switchingly connecting resistors valued R, 0.625R, 1.25R, 2.5R and 5R in parallel.

Using such parallel resistor selective connection to effect a linear step gain control, one is dividing the input signals $V_{IN}$, $V_{INREF}$ so that operational amplifier device 12 is not required to handle rail-to-rail swing of input signals $V_{IN}$, $V_{INREF}$. Swing ability of operational amplifier device 12 at output locus 18 is the main requirement that must be met by operational amplifier device 12.

FIG. 2 is a flow diagram illustrating the method of the present invention. In FIG. 2, a method 100 for buffering a signal with a programmable gain programmable to various values in discrete increments begins at a START locus 102. Method 100 continues with the step of, in no particular order: (1) providing an operational amplifier device having a first input locus for receiving a first signal, having a second input locus for receiving a second signal and having an output locus for presenting an output signal, as indicated by a block 104; (2) providing a feedback circuit coupled between the output locus and the second input locus, as indicated by a block 106; (3) providing a reference signal source coupled with the first input locus via a supply circuit for presenting a reference signal to the first input locus, as indicated by a block 108; (4) providing a first resistor network coupled between a first signal locus and the first input locus; the first resistor network including a first plurality of parallel-connected first resistors; selected first resistors of the first plurality of parallel-connected resistors being independently switchingly coupled for independently selectable inclusion in a first connecting of the first signal locus with the first input locus, as indicated by a block 110; and (5) providing a second resistor network coupled between a second signal locus and the second input locus; the second resistor network including a second plurality of parallel-connected second resistors; selected second resistors of the second plurality of parallel-connected resistors being independently switchingly coupled for independently selectable inclusion in a second connecting of the second signal locus with the second input locus, as indicated by a block 112.

Method 100 continues with the step of, in no particular order: (1) switchingly coupling the selected first resistors and operating the first resistor network to convey a first input signal from the first signal locus to the first input locus, as indicated by a block 114; and (2) switchingly coupling the selected second resistors and operating the second resistor network to convey a second input signal from the second signal locus to the second input locus, as indicated by a block 116. The gain is established by at least one of the supply circuit and the selected first resistors, and the feedback circuit and the selected second resistors. Method 100 terminates at an END locus 118.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. An amplifier apparatus having a gain; said gain being programmable to various values in discrete increments; the apparatus comprising:
  (a) an operational amplifier device having a first input locus for receiving a first signal, having a second input locus for receiving a second signal and having an output locus for presenting an output signal;
  (b) a feedback circuit coupled between said output locus and said second input locus;
  (c) a reference signal source coupled with said first input locus via a supply circuit for presenting a reference signal to said first input locus;
  (d) a first resistor network coupled between a first signal locus and said first input locus; said first resistor network conveying a first input signal from said first signal locus to said first input locus; said first resistor network comprising a first plurality of parallel-connected first resistors; selected first resistors of said first plurality of parallel-connected resistors being independently switchingly coupled for independently selectable inclusion in a first connecting of said first signal locus with said first input locus;
  (e) a second resistor network coupled between a second signal locus and said second input locus; said second resistor network conveying a second input signal from said second signal locus to said second input locus; said second resistor network comprising a second plurality of parallel-connected second resistors; selected second resistors of said second plurality of parallel-connected resistors being independently switchingly coupled for independently selectable inclusion in a second connecting of said second signal locus with said second input locus; said gain being established by at least one of said supply circuit and said selected first resistors, and said feedback circuit and said selected second resistors.

2. An amplifier apparatus having a gain as recited in claim 1 wherein said operational amplifier device is configured for non-inverting operation.

3. An amplifier apparatus having a gain as recited in claim 1 wherein said discrete increments are substantially equal increments.

4. An amplifier apparatus having a gain as recited in claim 1 wherein said first resistor network and said second resistor network are substantially similar.

5. An amplifier apparatus having a gain as recited in claim 4 wherein said selected first resistors and said selected second resistors contribute substantially the same resistance in effecting their respective inclusion in said first connecting and said second connecting.

6. An amplifier apparatus having a gain as recited in claim 2 wherein said discrete increments are substantially equal increments.

7. An amplifier apparatus having a gain as recited in claim 2 wherein said first resistor network and said second resistor network are substantially similar.

8. An amplifier apparatus having a gain as recited in claim 7 wherein said selected first resistors and said selected second resistors contribute substantially the same resistance in effecting their respective inclusion in said first connecting and said second connecting.

9. An amplifier apparatus having a gain as recited in claim 6 wherein said first resistor network and said second resistor network are substantially similar.

10. An amplifier apparatus having a gain as recited in claim 9 wherein said selected first resistors and said selected second resistors contribute substantially the same resistance in effecting their respective inclusion in said first connecting and said second connecting.

11. An improved operational transconductance amplifier apparatus having a first input locus, a second input locus and an output locus; the apparatus having a feedback circuit coupled between said output locus and said second input locus; the apparatus receiving a reference signal from a supply circuit coupling said first input locus with a reference signal source; the apparatus having a gain established by at least one of said supply circuit in cooperation with a first resistance or said feedback circuit in cooperation with a second resistance; the improvement comprising:
(a) said first resistance comprising a first plurality of parallel-connected first resistors; selected first resistors of said first plurality of parallel-connected resistors being independently switchingly coupled for independently selectable inclusion in a first connecting of said first signal locus with said first input locus;
(b) said second resistance comprising a second plurality of parallel-connected second resistors; selected second resistors of said second plurality of parallel-connected resistors being independently switchingly coupled for independently selectable inclusion in a second connecting of said second signal locus with said second input locus.

12. An improved operational transconductance amplifier apparatus as recited in claim 11 wherein said operational amplifier device is configured for non-inverting operation.

13. An improved operational transconductance amplifier apparatus as recited in claim 11 wherein said discrete increments are substantially equal increments.

14. An improved operational transconductance amplifier apparatus as recited in claim 11 wherein said first resistor network and said second resistor network are substantially similar.

15. An improved operational transconductance amplifier apparatus a gain as recited in claim 14 wherein said selected first resistors and said selected second resistors contribute substantially the same resistance in effecting their respective inclusion in said first connecting and said second connecting.

16. An improved operational transconductance amplifier apparatus as recited in claim 12 wherein said discrete increments are substantially equal increments.

17. An improved operational transconductance amplifier apparatus as recited in claim 12 wherein said first resistor network and said second resistor network are substantially similar.

18. An improved operational transconductance amplifier apparatus as recited in claim 17 wherein said selected first resistors and said selected second resistors contribute substantially the same resistance in effecting their respective inclusion in said first connecting and said second connecting.

19. An improved operational transconductance amplifier apparatus as recited in claim 16 wherein said first resistor network and said second resistor network are substantially similar.

20. A method for buffering a signal with a programmable gain; said gain being programmable to various values in discrete increments; the method comprising the steps of:
(a) in no particular order:
(1) providing an operational amplifier device having a first input locus for receiving a first signal, having a second input locus for receiving a second signal and having an output locus for presenting an output signal;
(2) providing a feedback circuit coupled between said output locus and said second input locus;
(3) providing a reference signal source coupled with said first input locus via a supply circuit for presenting a reference signal to said first input locus;
(4) providing a first resistor network coupled between a first signal locus and said first input locus; said first resistor network comprising a first plurality of parallel-connected first resistors; selected first resistors of said first plurality of parallel-connected resistors being independently switchingly coupled for independently selectable inclusion in a first connecting of said first signal locus with said first input locus; and
(5) providing a second resistor network coupled between a second signal locus and said second input locus; said second resistor network comprising a second plurality of parallel-connected second resistors; selected second resistors of said second plurality of parallel-connected resistors being independently switchingly coupled for independently selectable inclusion in a second connecting of said second signal locus with said second input locus;
(f) in no particular order:
(1) switchingly coupling said selected first resistors and operating said first resistor network to convey a first input signal from said first signal locus to said first input locus; and
(2) switchingly coupling said selected second resistors and operating said second resistor network to convey a second input signal from said second signal locus to said second input locus; said gain being established by at least one of said supply circuit and said selected first resistors; and said feedback circuit and said selected second resistors.

* * * * *